United States Patent [19]
Kendall et al.

[11] 3,961,325
[45] June 1, 1976

[54] MULTIPLE CHANNEL ANALOG-TO-DIGITAL CONVERTER WITH AUTOMATIC CALIBRATION

[75] Inventors: Larry J. Kendall, Concord; Larry D. Snyder, San Jose, both of Calif.

[73] Assignee: Fairchild Camera and Instrument Corporation, Mountain View, Calif.

[22] Filed: July 15, 1974

[21] Appl. No.: 488,339

[52] U.S. Cl. .................. 340/347 CC; 340/347 AD
[51] Int. Cl.² ........................................ H03K 13/20
[58] Field of Search ............... 340/347 AD, 347 CC; 179/15 A

[56] References Cited
UNITED STATES PATENTS

| | | | |
|---|---|---|---|
| 2,787,418 | 4/1957 | MacKnight | 340/347 AD |
| 2,824,285 | 2/1958 | Hunt | 340/347 AD |
| 2,897,486 | 7/1958 | Alexander | 340/347 AD |
| 2,963,697 | 12/1960 | Giel | 340/347 AD |
| 3,349,390 | 10/1967 | Glassman | 340/347 AD |
| 3,493,961 | 2/1970 | Hansen | 340/347 CC |
| 3,530,459 | 9/1970 | Chatelon | 340/347 AD |
| 3,582,940 | 6/1971 | Kihlberg | 340/347 AD |
| 3,665,305 | 5/1972 | Petrohilos | 340/347 AD |
| 3,678,505 | 7/1972 | Mostyn | 340/347 AD |
| 3,750,142 | 7/1973 | Barnes | 340/347 CC |

*Primary Examiner*—Charles D. Miller
*Attorney, Agent, or Firm*—Alan H. MacPherson; Henry K. Woodward; J. Ronald Richbourg

[57] ABSTRACT

An analog-to-digital converter for converting simultaneously a plurality of analog signals into their digital equivalence. The analog-to-digital converter is comprised of a ramp generator, a digital counter, control means, a plurality of output buffers and a plurality of analog comparators. The control unit maintains the digital counter and ramp generator in a fixed relationship such that the analog-to-digital converter automatically compensates for variations in the counter and/or ramp generator operations. The control means maintains the time correspondence of a full scale digital count within the digital counter with a full scale analog value of the ramp output generated by the ramp generator. The control unit resets the digital counter to zero upon the occurrence of a designated zero analog value of the ramp output such that the time between the analog zero value and the analog full scale value will correspond to a constant number of counts of the counter.

5 Claims, 5 Drawing Figures

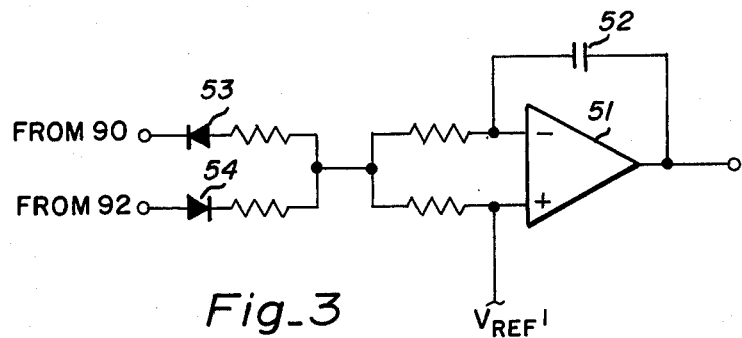
Fig_3
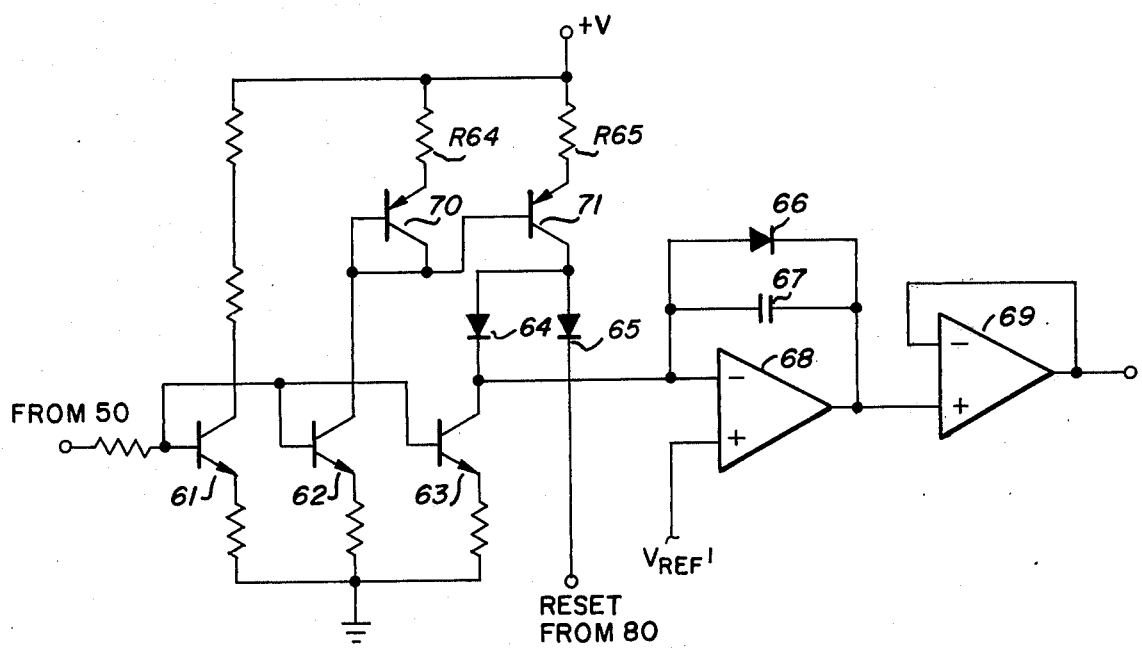
Fig_4

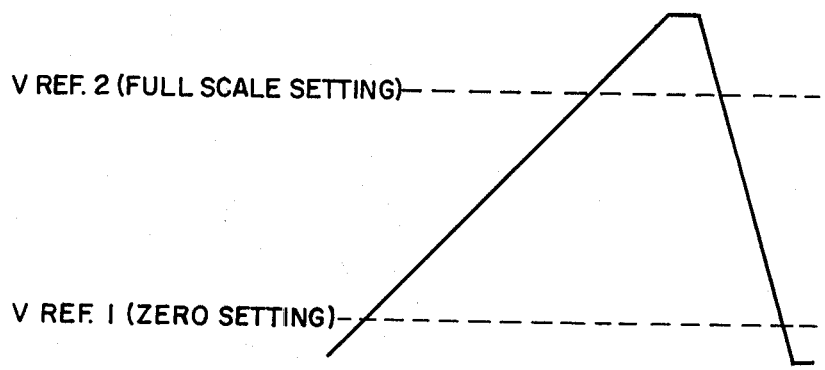
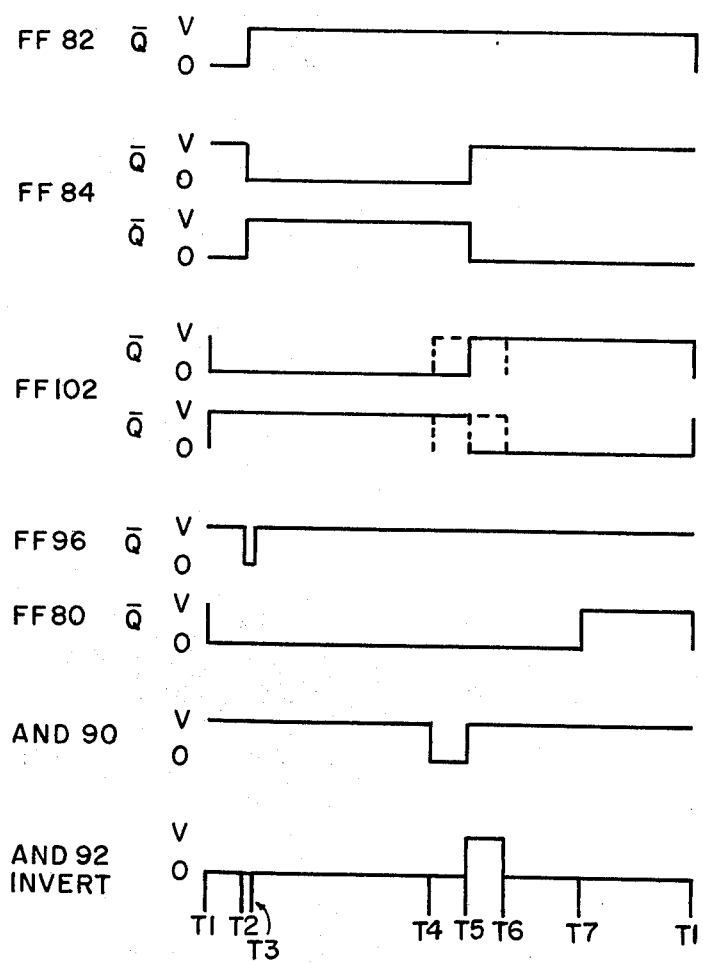
Fig_5

MULTIPLE CHANNEL ANALOG-TO-DIGITAL CONVERTER WITH AUTOMATIC CALIBRATION

BACKGROUND OF THE INVENTION

1. Field of the Invention

This invention relates to analog-to-digital converters and more particularly to analog-to-digital converters for the simultaneous converting of a plurality of analog signals into the corresponding digital values. More specifically, the analog-to-digital converter comprises a control means for controlling a ramp generator and digital counter such that the ramp generator and digital counter are maintained in a constant operational relationship.

2. Description of the Prior Art

It is common to provide systems which will produce digital readouts of the levels of analog signals deriving from multiple input channels on a multiplex basis. Typically, the several channels are sequentially sampled in some predetermined order and the samples apply to a single output channel including a suitable amplifier and analog-to-digital converter. When the analog input signals are of a low level type and slowly varying times, special precautions are necessary to provide an accurate readout and to prevent any deleterious loading effects on input signals by the measuring apparatus. In such cases the measuring apparatus must be of relatively high input impedance to provide the necessary isolation between input and output and must be extremely stable and of high sensitivity. Moreover, the amplifier must be responsive in rapid fashion to the voltage level differences which are present at the input terminals as each channel is sequentially connected to the single output channel. The prior art of multiple channel analog-to-digital converters is exemplified by U.S. Pat. Nos. 3,411,153; 3,448,446; 3,564,538; 3,455,397 and 3,742,489.

Conventional counting type analog-to-digital converters effect the conversion by counting the number of digital counts that occur during a period of time that is defined by the analog signal being converted. One specific type of counting analog-to-digital converter is that of the dual slope type. The prior art of analog-to-digital converter type is exemplified by U.S. Pat. Nos. 3,349,391; 3,624,638; 3,699,318; 3,728,625; and 3,747,089.

SUMMARY OF THE PRESENT INVENTION

Briefly, the analog-to-digital converter is comprised of a ramp generator, a digital counter, a control means, a plurality of output buffers and a plurality of analog comparators. The ramp generator generates a ramp output signal which is compared with the plurality of analog input signals by the plurality of analog comparators. Whenever any of the analog comparators indicates a correspondence in value between the ramp output and the analog input signal, an output compare signal is generated. The compare signal transfers the count within the digital counter into the output buffer that is associated with the analog comparator generating the compare signal. The control unit of the analog-to-digital converter causes the digital counter to be reset to a zero value when the ramp output equals a first value which is defined as the zero setting for the analog-to-digital converter. The control unit further measures the time displacement between the occurence of a specified count within the digital counter, a digital full scale value, to a second value of the ramp output, the analog full scale value. The control unit uses the time displacement between the occurrence of these two signals and which one of the two signals occurred first in time to adjust the slope of the ramp output of the ramp generator such that the digital full scale value and analog full scale value will occur in time coincident with each other.

An advantage of this invention is that it allows the conversion of a plurality of input analog signals to be simultaneously converted into their digital equivalence without the requirement of switching or multiplexing the signals to the analog-to-digital converter as was taught in the prior art.

Another advantage of the invention is that the analog-to-digital converter converts a plurality of analog signals into their digital value while maintaining the same relative relationship between each of the digital output signals that existed between each of the relative analog input signals.

Another advantage of the multiple input analog-to-digital converter is that it allows the conversion of a plurality of analog signals to their digital equivalence faster while encountering no switching noise as found in the prior art.

The foregoing and other advantages of the invention will be apparent from the following more particular description of the preferred embodiment of the invention as illustrated in the accompanying drawings.

IN THE DRAWINGS

FIG. 3 is a schematic diagram of the error generator as shown in FIG. 2.

FIG. 4 is a schematic diagram of the ramp generator as shown in FIG. 2.

FIG. 5 is a series of wave forms illustrating the operation of the second embodiment of the multiple channel analog-to-digital converter of the invention as shown in FIG. 2.

DETAILED DESCRIPTION OF THE PREFERRED EMBODIMENT

First Preferred Embodiment of the Invention

Figure 1:
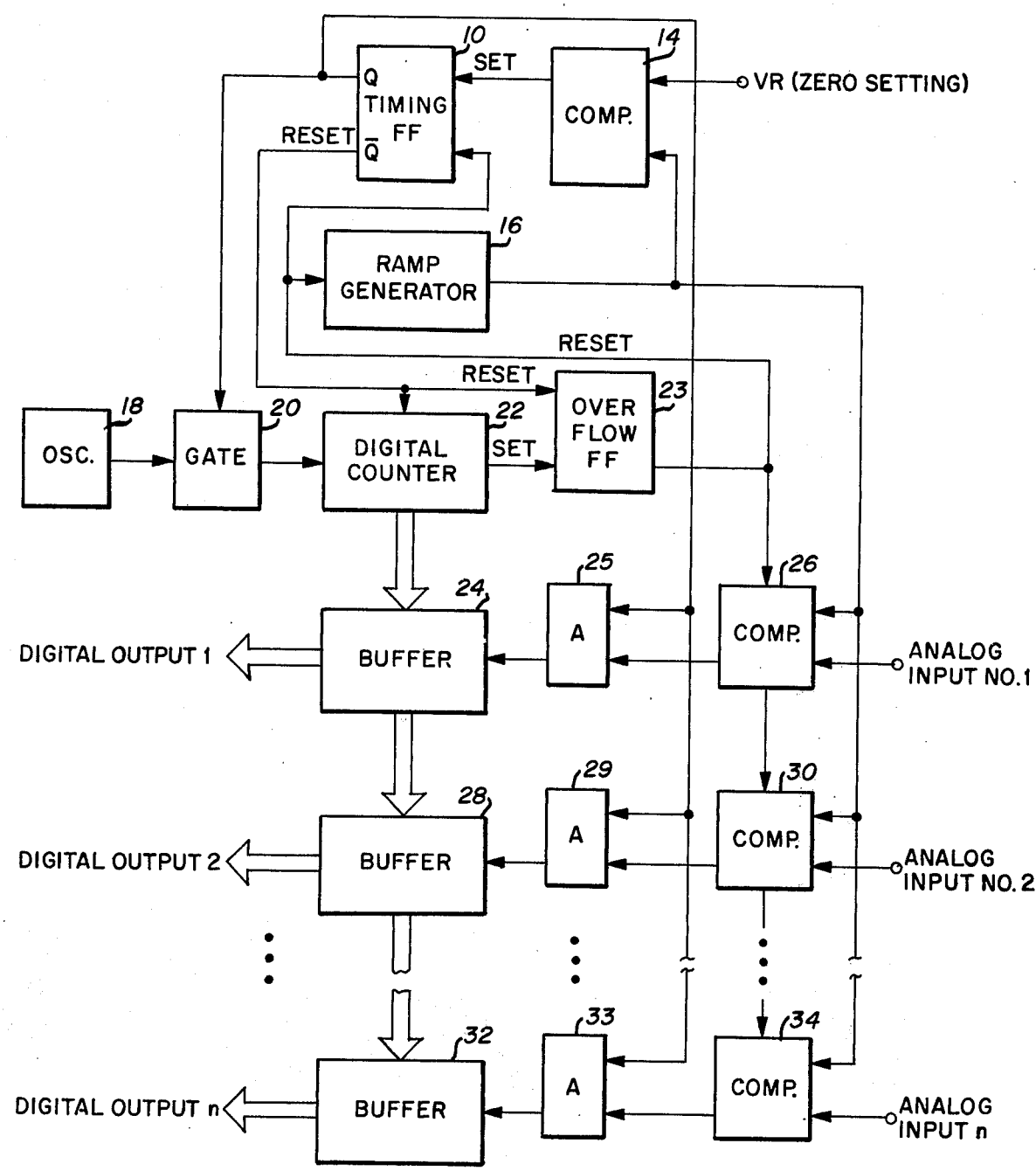
FIG. 1 is a block diagram of the first embodiment of the multiple channel analog-to-digital converter of the invention.

FIG. 1 shows a multiple channel analog-to-digital converter. Oscillator 18 supplies count pulses to digital counter 22 via gate 20. The over flow output of digital counter 22 is connected as a set input to overflow flip-flop 23. The output of overflow flip-flop 23 is connected to the reset input of ramp generator 16, to the reset input of timing flip-flop 10, which indicates a start of a conversion cycle, and to the reset input of channel comparators 26, 30 and 34. The output of the ramp generator is connected as a first input to analog comparator 14. Analog comparator 14 has as its second input the zero setting reference voltage which will be used as a means of control when counter 22 begins counting. The output of comparator 14 is connected to the set input of timing flip-flop 10. A first output of timing flip-flop 10 is connected to gate 20 for controlling when count pulses from oscillator 18 may be passed to digital counter 22. A second output of timing flip-flop 10 is connected to the reset input of digital counter 22 and to the reset input of overflow flip flop 23. Each channel is comprised of a buffer, a coincidence gate and an analog comparator. Channel No. 1 includes analog comparator 26 having as its inputs analog input signal No. 1 and the output of ramp generator 16. The output of comparator 26 is connected to a first input of coincidence gate 25. Coincidence gate 25 has its second input the first output of timing flip-flop 10. The output of coincidence gate circuit 25 is connected to buffer 24 for controlling the transfer of the digital count from digital counter 22 into buffer 24. Buffer 24 supplies the digital output equivalent of the analog input signal of comparator 26. In a similar manner channel 2 is comprised of comparator 30, coincidence gate 29 and buffer 28. It can be realized that any number of channels may be employed. FIG. 1 shows the $n^{th}$ channel as being comprised of analog comparator 34, coincidence gate 33 and buffer 32.

It can be seen in FIG. 1 that the output of ramp generator 16 is one input to the analog comparator in each channel of the multiple channel analog-to-digital converter. Further the output of digital counter 22 is the input to the buffer in each channel of the multiple channel analog-to-digital converter.

Operation of the First Preferred Embodiment

Let is be assumed that the digital counter has just reached its maximum count so that the next count pulse will cause an overflow out of digital counter 22. The next count pulse from oscillator 18 will pass through gate 20 and cause digital counter 22 to overflow, setting flip-flop 23. The output of flip-flop 23 will therefore start a new cycle by resetting all the channel analog comparators 26, 30 and 34, ramp generator 16 and timing flip-flop 10. When timing flip-flop 10 is reset, its Q output will go down to a low level so as to close gate 20 and prohibit any further count pulses from oscillator 18 from reaching digital counter 22. Further, the down state of the Q output of timing flip-flop 10 will also deactivate channel coincident gates 25, 29 and 33. The $\overline{Q}$ output of timing flip-flop 10 will go positive causing the digital counter 22 to be reset to zero and the overflow flip-flop 23 to be reset. The ramp output of ramp generator 16 will start increasing, and when it reaches a value associated with the zero setting reference voltage VR, comparator 14 will generate an output signal setting timing flip-flop 10. The Q output of timing flip-flop 10 will become positive opening up gate 20 allowing the digital counter 22 to begin counting. The Q output of flip-flop 10 will further energize one leg of channel coincidence gates 25, 29 and 33.

When analog input signal to comparator 26 equals the ramp signal from ramp generator 16, comparator 26 will activate channel coincidence gate 25 causing the content of the digital counter 22 to be stored in buffer 24. The coincidence gates are such that they effectively latch up once they are operated such that the first digital value associated with the first point of coincidence of each cycle of operation is stored within the buffer within each channel. The same operation occurs for channels 2 through $n$. During each cycle of operation, that is from the time the digital counter starts counting to the time the digital counter reaches its full scale value, each of the channels will have established a digital value for the analog input signal associated with that channel. The cycle time will be equivalent to the time it takes counter 22 to go from a zero value to an overflow value plus the time it takes the ramp generator to reset and reattain the initial value of the zero setting reference voltage VR.

Second Preferred Embodiment

Figure 2:
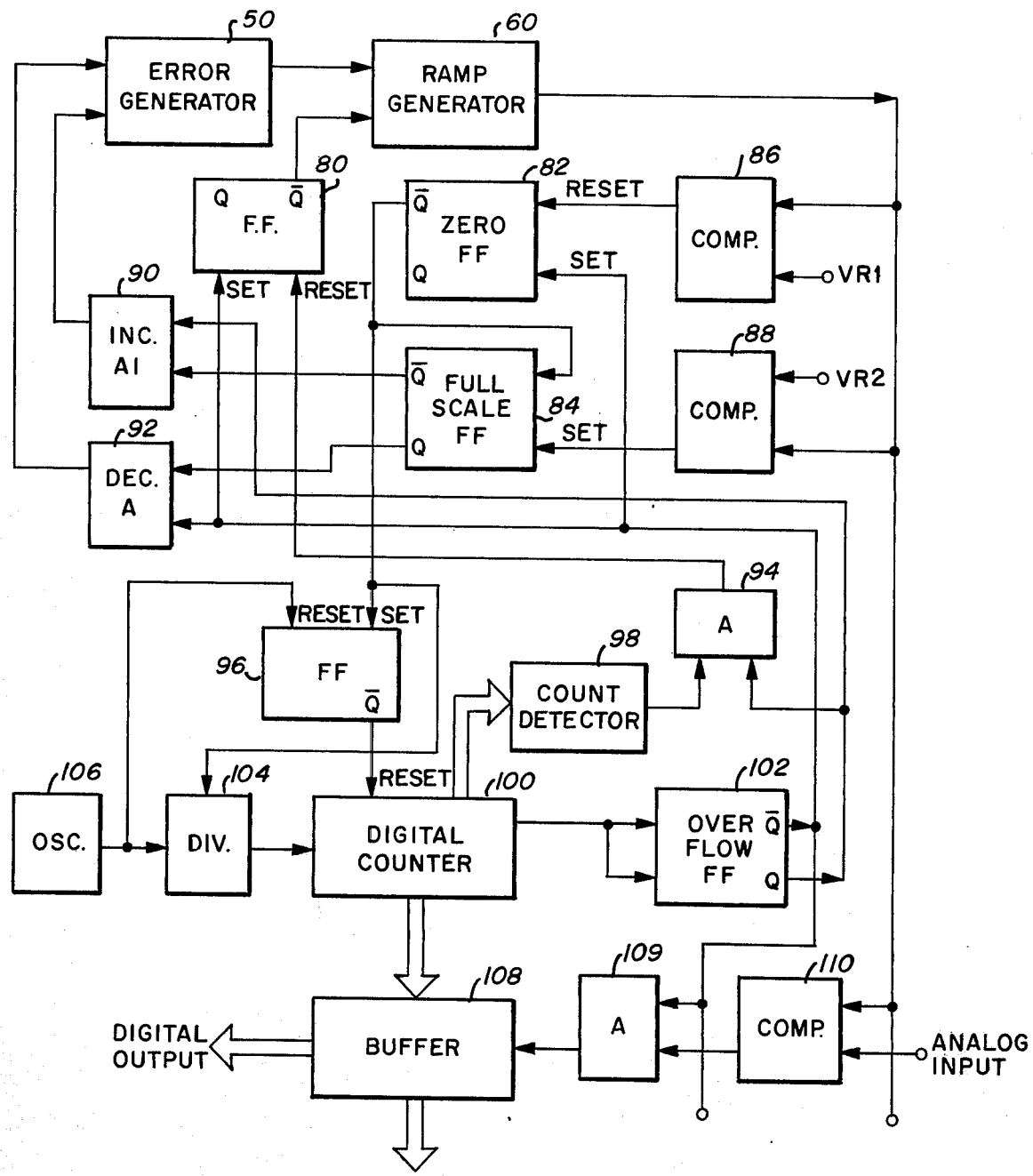
FIG. 2 is a block diagram of the second embodiment of the multiple channel analog-to-digital converter of the invention having the control means for maintaining the ramp generator and digital counter in the fixed time relationship with each other.

FIG. 2 shows the second preferred embodiment of the multiple channel analog-to-digital converter. It is highly desirable to have the analog-to-digital converter be self-correcting for variations in its own components due to temperature, aging, or the like. In this embodiment, a more sophisticated control means is incorporated which will maintain the digital counter 100 in a fixed time relationship to the voltage control ramp generator 60, thereby compensating for variations within the system components. Basically, the second preferred embodiment differs from the first preferred embodiment only in the sophistication of the controlling of the output of ramp generator 60 with reference to digital counter 100. It should be realized that the analog-to-digital converter of the second embodiment is further unique due to the sophistication of the controlling means for controlling the relationship between voltage control ramp generator 60 and digital counter 100, irrespective of how many channels is connected to digital counter 100 or ramp generator 60.

Oscillator 106 is connected to the input of divider 104. The output of divider 104 are count pulses for digital counter 100. Digital counter 100 may be a binary counter, a binary coded decimal counter or a counter in any base number that the designer may choose. The overflow output of counter 100 is fed as a complement input to overflow flip-flop 102. Detector 98 monitors the digital count within counter 100 and supplies an input signal to coincidence gate 94 when a specific designated count is reached. The $\overline{Q}$ output from overflow flip-flop 102 is connected to set input to zero flip-flop 82 as a set input to flip-flop 80 and as one input to AND circuit 92. The Q output of flip-flop 102 is connected to the other input of coincidence gate 94, to one input of each channel coincidence gate 109, and to one input of AND Invert 90. The output of digital counter 100 is fed to each channel buffer 108 of the multiple channel analog-to-digital converter. The output of coincidence gate 94 is connected to the reset input of flip-flop 80.

Comparator 86 has as a first input the output of ramp generator 60 and as a second input a zero setting reference voltage VR1. The output of comparator 86 is connected to the reset input of zero flip-flop 82. The $\overline{Q}$ output of zero flip-flop 82 is connected to the reset input of full scale flip-flop 84 and to the set input of flip-flop 96.

Comparator 88 has as one of its inputs the ramp output from voltage control ramp generator 60 and as a second input analog full scale reference voltage VR2. The output of comparator 88 is connected to the set input to full scale flip-flop 84. The Q output of full scale output 84 is connected to one of the inputs and AND Invert 90. The Q output of full scale flip-flop 84 is connected to one of the inputs of AND 92.

Oscillator 106 is also connected as a reset input to flip-flop 96. The $\overline{Q}$ output of flip-flop 95 resets digital counter to zero and resets the channel coincidence gates 109 for each channel of the multiple channel analog-to-digital converter.

Error generator 50 has a first input from AND Invert 90 and a second input from AND 92. The output of error generator 50 is connected to voltage control ramp generator 60 as the slope rate control signal. With reference to FIG. 3, there it is shown the circuit for error generator 50. Basically, operational amplifier 51 and capacitor 52 comprise an integrator. Charge will be added to capacitor 52 during any period of time that the input from AND Invert 90 is negative causing diode 53 to conduct. In a similar manner, charge will be removed from capacitor 52 during any period that AND 92 is positive causing diode 52 to conduct. It can readily be realized that the amount of charge on capacitor 52 therefore can be regulated by the making positive of the output from AND 92 or making negative the output from AND-INVERT 90. It is by controlling the outputs of AND INVERT 90 and AND 92 that the charge on capacitor 52 is controlled so as to correct the slope of the ramp of the generator.

Referring again to FIG. 2, voltage control ramp generator 60 has as its inputs the slope control signal from error generator 50 and the slope sign control signal from flip-flop 80. The output of voltage control ramp generator 60 is connected to comparators 86, 88 and the channel comparator 110 in each of the channels of the multi-channel analog-to-digital converter. With reference to FIG. 4, there is shown the schematic diagram for voltage control ramp generator 60. The voltage from error generator 50 is connected to the base of transistors 61, 62 and 63, for establishing the operating point of these transistors. Operational amplifier 69 is a buffer amplifier having its positive (+) input coupled to the output of an amplifier 68. Amplifier 68 in conjunction with capacitor 67 constitute an integrator for generating the desired ramp output signal. Diode 66 establishes a zero clamp level for the integrator formed by operational amplifier 68 and capacitor 67. The voltage value on the reset line which is connected to the $\overline{Q}$ output of flip-flop 80 determines whether charge on capacitor 67 is increasing or decreasing. When the $\overline{Q}$ output of flip-flop 80 is negative, capacitor 67 will increase in charge at a rate which is controlled by the current flowing through transistor 63. The rate at which current is allowed to pass through these transistors is a function of the error voltage being received at their respective bases from error generator 50. When the $\overline{Q}$ output of flip-flop 80 goes positive, diode 65 is turned off allowing capacitor 67 to discharge at a rate controlled by the current through transistor 71 (as defined by the relationship of resistors R64 and R65) minus the current through transistor 63. It should be here noted that the rate at which capacitance 67 charges and discharges does not have to be the same. The circuit herein shown will allow the discharge of capacitor 67 to be five times faster than the charge of capacitor 67 because resistor R64 is six times larger than resistor R65. The circuit shown in FIG. 4 provides that for any given error voltage, current of I will flow during charge time of capacitor 67 and a current of 5I will flow during the discharge time. It should be noted that the maximum value of the ramp can be controlled by clamping integrator 68 to some maximum value.

Operation of the Second Preferred Embodiment

The operation of the second preferred embodiment will be more clearly understood by referring to FIG. 5 in conjunction with FIG. 2.

Overflow flip-flop 102 basically controls the sign of the ramp generator 60 and thereby controls the starts of the cycles of operation of the multi-channel analog-to-digital converter.

At time T1 a clock pulse will be emitted by divider 104 to cause digital counter 100 to overflow, thereby complementing overflow flip-flop 102 such that the $\overline{Q}$ output becomes positive while the Q output becomes negative. When the $\overline{Q}$ output of flip-flop 102 becomes positive, each of the channel coincidence gates 109 in each of the analog channels within the multi-channel analog-to-digital converter becomes active. The $\overline{Q}$ output of flip-flop 102 further causes flip-flops 80 and 82 to be set while activating one input of the AND 92. The $\overline{Q}$ output of flip-flop 80 will become negative at this time, causing the voltage control ramp generator 60 to change from a discharge state to a charge state, thereby starting a new ramp.

Let it be assumed for the sake of this example that in the previous cycle the full scale analog value was in time coincident with the full scale digital value such that the output of the error generator will control the slope of the ramp at its nominal designed value. It should also be here noted that for timing purposes throughout this example, a transition from a negative to positive state is used as the activating transition for all of the flip-flops within the system. It is understood by those skilled in the art that the negative transitions, i.e., from a positive to a negative value, could have been used to control the timing, as could a combination of positive and negative transitions as long as the necessary timing relationships between the different circuit components are maintained.

At time T2 the ramp voltage from ramp generator 60 will equal the zero setting reference voltage VR1. This condition will be detected by comparator 86 which will then go positive causing zero flip-flop 82 to be reset. When zero flip-flop 82 becomes reset, its $\overline{Q}$ output goes from a negative to positive state, thereby causing full scale flip-flop 84 to be reset, flip-flop 96 to be set and divider 104 to be reset to a zero setting. Oscillator 106 is operating at a rate four times higher than the desired count rate of digital counter 100. Divider 104 divides the output frequency of oscillator 106 by 4, thereby obtaining the desired count rate. The output of oscillator 106 is fed as reset pulses to flip-flop 96. Therefore, the next clock occurring after zero flip-flop 82 becomes reset will reset flip-flop 96. The $\overline{Q}$ output of flip-flop 96 will go from a negative to positive state thereby causing digital counter 100 to be reset to zero preparing counter 100 for the next cycle.

This timing arrangement is used so as to insure that the counter 100 will always start at a specific time after the resetting of zero flip-flop 82 and to allow the digital counter and buffer electronic components sufficient time to settle before the next count pulse arrives. By this arrangement the zero count value in digital counter 100 is locked to the occurrence of a first value of the ramp of ramp generator 60 which is equal to the zero setting reference voltage VR1.

Digital counter 100 will begin to count pulses emitted by the divider 104. During the time that the digital counter is counting from a zero value to a full scale value, any comparison in any channel comparator 110 will cause the value of the digital counter 100 then existing to be transferred into the associated channel buffer 108 of the channel in which the comparison was made. Therefore, all of the analog input signals are being compared simultaneously to the output ramp of ramp generator 60, and upon a comparison being made the value of digital counter 100 is then being transferred to the channel buffer 108 such that the channel buffer 108 will contain the digital equivalent of the analog signal associated with that channel. It therefore can be understood that when digital counter 100 has reached full scale, all comparisons for all channels have been made if, in fact, any comparison is to be made during that cycle of operation.

In essence, an error signal is to be generated such that the slope of the ramp or the frequency of the ramp generator is to be increased or decreased for maintaining the time relationship between ramp generator 60 and digital counter 100.

At time T5 comparator 88 will sense the condition that the ramp signal from ramp generator 60 is equal to the full scale reference voltage VR2. Comparator 88 will therefore go positive setting full scale flip-flop 84. The $\overline{Q}$ output of full scale flip-flop 84 is one input to AND invert 90 which controls the increase in charge on capacitor 62 of error generator 60 thereby causing the slope of the ramp to increase or become faster. The Q output of full scale flip-flop 84 is connected as one input to AND 92, whose positive state controls the removal of charge from capacitor 52, thereby causing the slope of the ramp to decrease or become slower.

When counter 100 overflows, overflow flip-flop 102 will be complemented such that the Q output will become positive and the $\overline{Q}$ output will become negative. This condition signifies that the analog-to-digital conversion period of this cycle of operation has been completed and the remaining part of the cycle will be used to correct for any error between ramp generator 60 and digital counter 100.

AND Invert 90 compares the Q output of full scale flip-flop 84 with the $\overline{Q}$ output of overflow flip-flop 102. The AND 92 compares the $\overline{Q}$ output of full scale flip-flop 84 with the Q output of overflow flip-flop 102. Specifically viewing FIG. 5, it can be seen with regards to the waveforms for flip-flop 84 and flip-flop 102 that if flip-flop 102 is complemented at time T5, that then the output of AND Invert 90 will always be positive and the output of AND 92 will always be negative.

If, however, digital counter 100 overflowed at time T4, that is, before the analog ramp reached its full scale value, a negative pulse will appear from AND Invert 90 whose width is equal to the time displacement between the occurrence of the overflow of digital counter 100 and the reaching of the ramp signal of its full scale value. If digital counter 100 reaches its full scale value prior to the occurrence of the analog full scale condition, then in order to bring ramp generator 60 into correspondence with digital counter 100, the slope of the ramp must be increased. To this end a negative input voltage is generated by AND Invert 90 for an amount of time that is equal to the error existing between the time occurrence of the two events. This will cause charge on capacitor 52 to be increased and as previously described, will result in the slope of ramp from ramp generator 60 to increase in such a manner as to tend to bring the output of ramp generator 60 into the proper time relationship with the output of digital counter 100.

In the same sense, if the digital counter 100 did not overflow until time T6, then AND 92 would produce a positive pulse whose width is again equal to the time displacement between the occurrence of the two events. In this case the analog ramp reached its full scale setting prior to the time that the digital counter reached its full scale value, resulting in the charge on capacitor 52 being reduced in direct relationship to the width of the positive pulse from AND 92. This decrease in charge on capacitor 52 of error generator 50 will result in the slope of the ramp being decreased such that the time occurrence of the ramp signal, reaching its full scale setting, will no longer, thereby bringing the ramp generator 60 into closer time relationship with digital counter 100.

It can be realized that by this method of comparing the time occurrence between the full scale digital value and the full scale analog value, that the analog ramp signal can be effectively phase-locked to the time occurrence of the digital full scale value of counter 100.

Therefore, counter 100 is now (first) locked such that a zero count within counter 100 will occur at a time when the analog ramp reaches a first value equal to the zero setting reference voltage VR1, and (second) the full scale reference voltage VR2 ramp generator 60 is phase locked to the full scale count of counter 100. The system will automatically adapt for any variations in either the digital counter or the ramp generator as well as changes in environment.

At time T4, 5 or 6, overflow flip-flop 102 will be complemented, causing the Q output to go positive, and the $\overline{Q}$ output to become negative. When the $\overline{Q}$ output of flip-flop 102 becomes negative, it disenables the channel coincidence gates 109 within each of the channels such that no further transfer of digital counter 100 to buffer 108 can occur during the remaining portion of this cycle of operation. The Q output of flip-flop 102 will activate one input of AND circuit 94. It is desired to have the ramp continue to increase for some period of time after the digital counter 100 overflows such that the condition of the ramp reaching its full scale maximum value after the digital counter reaches its full scale value can be tested. To this end, digital counter 100 continues counting and its count is monitored by count detector 98.

At time T7, the specific count, equal to the time period of the continued increase ramp generation, is sensed by detector 98 causing the output of coincidence gate 94 to become positive causing flip-flop 80 to be reset. The $\overline{Q}$ output of flip-flop 80 will therefore go positive, causing the ramp generator to change signs such that the ramp starts to decrease in value. The ramp generator will discharge five times faster than it charged, as previously described, which will insure that the ramp generated by ramp generator 60 will reach its zero value prior to the second time that digital counter 100 will overflow. The second time that digital counter 100 overflows will be equivalent to the time occurrence of time T1 as previously described, and a full cycle is complete. In essence, the cycle of operation is equal to the time it takes for the digital counter to reach its full scale counter twice, plus the increment of count that occurs from the time the digital counter reaches its second full scale count and the time that the analog ramp reaches its zero setting reference voltage VR1.

While the invention has been particularly shown and described with reference to the preferred embodiments thereof, it will be understood by those skilled in the art that various changes in form and detail may be made therein without departing from the spirit and scope of the invention.

What is claimed is:

1. A multiple channel analog-to-digital converter comprising:
   a. a ramp generator for generating a ramp signal;
   b. a digital counter for generating a count output indicative of the instantaneous count within said counter;
   c. a control means responsive to said ramp signal and to the count within said digital counter and operative to maintain the time coincidence of a zero count in said counter and a first value of said ramp signal, and a full scale count in said counter and a second value of said ramp signal, wherein said control means comprises;
      i. a first means responsive to said ramp signal and operative to generate an analog full scale signal whenever said ramp signal equals said second value,
      ii. a second means responsive to the count in said counter and operative to generate a digital full scale signal whenever said counter reaches said full scale count, and
      iii. a third means responsive to said analog full scale signal and said digital full scale signal and operative to vary the slope of said ramp signal in accordance with the difference between the time occurrence of said analog full scale signal and said digital full scale signal,
      iv. a fourth means responsive to said ramp signal and operative to reset said counter to a zero count upon the occurrence of said first value;
   d. means comprising at least one channel, each channel comprising;
      i. a compare means responsive to an analog input signal and operative to generate a compare signal whenever said analog input is equal to said ramp output; and
      ii. a buffer means responsive to said compare signal and operative to transfer the count of said counter to said buffer for effectively producing in said buffers the digital value associated with the analog value of the analog input signal to said compare means.

2. A multi-channel analog-to-digital converter as recited in claim 1 wherein said control means comprises a fifth means responsive to the count in said counter and to said digital full scale signal and operative to control the sign of said ramp signal.

3. A multi-channel analog-to-digital converter as recited in claim 2 further comprising a sixth means responsive to said digital full scale signal and operative to block said compare signals upon the occurrence of said full scale count in said counter during each cycle of operation of the multi-channel analog-to-digital converter.

4. A multiple channel analog-to-digital converter comprising:
   a. an analog input signal;
   b. a ramp generator for generating a ramp signal;
   c. a digital counter for generating a count output indicative of the instantaneous count within said counter;
   d. a first detecting means responsive to said ramp signal and operative to generate a first output signal whenever said ramp output signal is equal to a reference voltage;
   e. a timing means responsive to said first output signal and to a full scale count in said counter and operative to reset said ramp generator upon the occurrence of said full scale count, and reset and start said counter upon the occurrence of said first output signal, wherein said timing means comprises;
      i. a second detector responsive to such full scale count and operative to generate a second output signal for resetting said ramp generator upon the occurrence of said full scale count; and
      ii. means responsive to said second and first output signals and operative to reset said counter and said second detector upon the occurrence of said second output signal and start said counter upon the occurrence of said first output signal;
   f. a compare means responsive to said analog input signal and operative to generate a compare signal when said analog input signal is equal to said ramp signal; and
   g. a buffer means responsive to said compare signal and operative to transfer the count of said counter to said buffer so as to effectively produce in said buffer the digital value associated with the value of said analog input signal, wherein each channel in the multiple channel analog-to-digital converter further comprises a blocking means responsive to the output of said timing means for preventing a compare signal from transferring the count in said counter to said buffer during the period of time between the occurrence of said second output signal and said first output signal.

5. An analog-to-digital converter as set forth in claim 4 wherein said reference voltage associated with said first detecting means is equal to the zero setting of said ramp signal.

* * * * *